United States Patent
Miyazaki et al.

(10) Patent No.: US 9,379,060 B2
(45) Date of Patent: Jun. 28, 2016

(54) GRAPHENE WIRING

(71) Applicant: Kabushiki Kaisha Toshiba, Minato-ku (JP)

(72) Inventors: Hisao Miyazaki, Kanagawa (JP); Tadashi Sakai, Kanagawa (JP); Masayuki Katagiri, Kanagawa (JP); Yuichi Yamazaki, Tokyo (JP); Naoshi Sakuma, Kanagawa (JP); Mariko Suzuki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/202,162

(22) Filed: Mar. 10, 2014

(65) Prior Publication Data

US 2014/0284800 A1    Sep. 25, 2014

(30) Foreign Application Priority Data

Mar. 19, 2013    (JP) .................. 2013-057004

(51) Int. Cl.
    *H01L 23/532* (2006.01)
(52) U.S. Cl.
    CPC ... *H01L 23/53276* (2013.01); *H01L 2924/0002* (2013.01)
(58) Field of Classification Search
    CPC .................................................. H01L 23/532
    USPC .......................................................... 257/750
    See application file for complete search history.

(56) References Cited

U.S. PATENT DOCUMENTS

| | | | |
|---|---|---|---|
| 4,515,709 A * | 5/1985 | Watanabe et al. | 252/509 |
| 8,378,335 B2 | 2/2013 | Yamazaki et al. | |
| 2007/0001220 A1* | 1/2007 | Tombler et al. | 257/330 |
| 2011/0006425 A1* | 1/2011 | Wada et al. | 257/750 |
| 2012/0068160 A1* | 3/2012 | Yamazaki et al. | 257/29 |
| 2014/0084250 A1 | 3/2014 | Wada et al. | |

FOREIGN PATENT DOCUMENTS

JP    2011-23420    2/2011

OTHER PUBLICATIONS

Office Action issued Apr. 1, 2014 in Japanese Patent Application 2013-057004 (with English translation).

* cited by examiner

*Primary Examiner* — Jerome Jackson, Jr.
*Assistant Examiner* — Lamont Koo
(74) *Attorney, Agent, or Firm* — Oblon, McClelland, Maier & Neustadt, L.L.P.

(57) ABSTRACT

A graphene wiring has a substrate, a catalyst layer on the substrate, a graphene layer on the catalyst layer, and a dopant layer on a side surface of the graphene layer. An atomic or molecular species is intercalated in the graphene layer or disposed on the graphene layer.

13 Claims, 4 Drawing Sheets

GRAPHENE WIRING

CROSS-REFERENCE TO RELATED APPLICATION

This application is based upon and claims the benefit of priority from Japanese Patent Application No. 2013-057004 Mar. 19, 2013; the entire contents of which are incorporated herein by reference.

FIELD

Embodiments described herein relate generally to a graphene wiring.

BACKGROUND

Increase in wiring delay in metal wiring with miniaturized multi-layered LSI and 3D memory is a large problem. In order to decrease the wiring delay, it is important to decrease wiring resistance and interwire capacitance. Application of a low-resistance material such as Cu, for example, is put into practical use for decreasing the wiring resistance. Unfortunately, Cu wiring also has problems such as stress-migration- or electromigration-induced degradation of reliability, a size effect-induced increase in electric resistivity, and embedding into fine via holes, and there has been a demand for wiring materials with lower resistance and higher current density tolerance.

Application of a carbon-based material such as a carbon nanotube and a graphene with an excellent physical property such as high current density tolerance, electric conduction property, thermal conductivity, and mechanical strength attracts attention as a next-generation wiring material expected to be low-resistance and highly reliable material. Especially, there have been studied wiring structures having lateral interlayer wiring formed using graphene. A method for forming a graphene wiring includes uniformly forming a graphene film on a substrate and patterning the graphene film into a wiring form or growing graphene on a catalyst layer that has been formed in a wiring pattern.

However, if a graphene wiring is made as thin as about 10 nm, the wiring may be turned into a semiconductor due to the quantum confinement effect of electrons, or the resistance of the wiring may increase due to the scattering effect at the edge.

DETAILED DESCRIPTION

A graphene wiring includes a substrate, a catalyst layer on the substrate, a graphene layer on the catalyst layer, and a dopant layer on a side surface of the graphene layer. An atomic or molecular species is intercalated in the graphene layer or disposed on the graphene layer.

Figure 1:
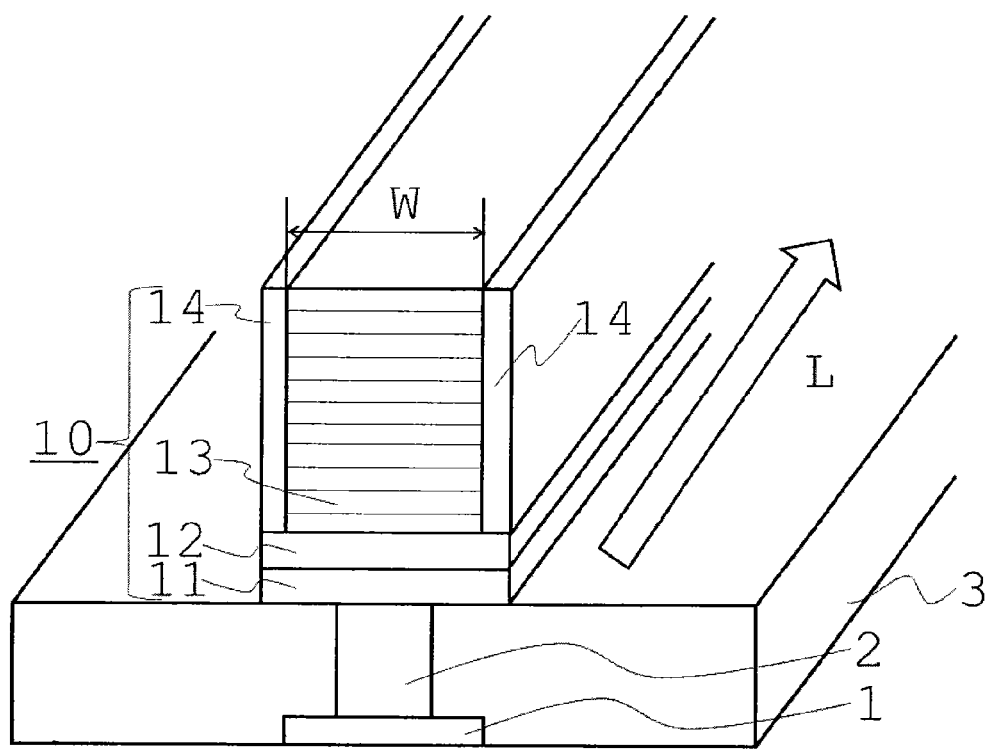
FIG. 1 is a schematic perspective view of a semiconductor device having a graphene wiring of an embodiment.

Hereinafter, a semiconductor device, a wiring, and a method of manufacturing them according to an embodiment will be described with reference to the drawings as needed. FIG. 1 is a perspective view of a semiconductor device 100 according to a first embodiment of the disclosure. The semiconductor device 100 includes a semiconductor substrate having an insulating film 3, a graphene wiring 10 on the insulating film 3, contact plugs 2 connected respectively to the lower and upper surfaces of the graphene wiring 10, and a conductive film 1 connected to the graphene wiring 10 via the contact plug 2. The contact plug 2 is formed in the contact layer insulating film 3.

The graphene wiring 10 includes a catalyst backing layer 11, a catalyst layer 12 formed on the catalyst backing layer 11, a graphene layer 13 formed on the catalyst layer 12, and dopant layers 14 on at least part of the sides of the graphene layer 13. An atomic or molecular species is intercalated in the graphene layer 13 or disposed on the graphene layer 13. In the graphene wiring 10, a current can flow along the longitudinal direction L of the wiring 10 in the graphene layer 13.

The catalyst backing layer 11 has a function as a co-catalyst for growth of graphene constituting the graphene layer 13. The catalyst backing layer 11 is made of, for example, a nitride or oxide of a metal such as Ti, Ta, Ru, or W. The catalyst backing layer 11 may have a multilayer structure having two or more different layers. The thickness of the catalyst backing layer 11 is, for example, in a range of 0.5 nm to 10 nm.

The catalyst layer 12 is made of a catalytic material capable of functioning as a catalyst for growth of graphene sheets constituting the graphene layer 13. The catalyst layer 12 is formed on the insulating film 3 or the catalyst backing layer 11. The catalytic material for the catalyst layer 12 may be an elemental metal or alloy containing one or more of Co, Ni, Fe, Ru, Cu, and so on, or a carbide or other compounds of any of these metals or alloys. The thickness of the catalyst layer 12 is, for example, in a range of 5 nm to 20 nm.

The graphene layer 13 is a wiring formed on the catalyst layer 12. The graphene layer 13 includes a single layer of graphene sheet or multiple layers of graphene sheet including at most 100 layers. The number of such layers in the graphene layer 13 can be adjusted by the manufacturing method. The graphene sheet may be a monolayer film of graphite and have a structure in which carbon atoms are arranged in a hexagonal lattice. The graphene layer 13 is formed continuously in the longitudinal direction L of the wiring 10. Therefore, the graphene layer 13 forms an electron transfer path along the longitudinal direction L of the wiring.

It is known that the mean free path of electrons in graphene is about 100 nm to 1 μm, which is far longer than the mean free path (about 40 nm) of electrons in Cu, which is a low-resistance metal material currently used in a variety of LSI devices. Therefore, graphene can be used as a low-resistance material to form the conductive layer of the wiring 10. The scattering effect at the edge should be effectively reduced. For this purpose, a wiring (graphene layer) width W of the graphene wiring 10 is preferably in a range of 3 nm to 100 nm. Conversion into semiconductor by the electron confinement effect should also be effectively reduced as well as the scattering effect at the edge. For this purpose, a wiring (graphene layer) width W of the graphene wiring 10 is preferably in a range of 3 nm to 30 nm. The graphene wiring width can be checked using a transmission electron microscope (TEM).

However, if the width of the graphene layer is reduced to about 10 nm, the semi-metallic graphene may be turned into a semiconductor and have increased resistance. The dopant layers 14 have the function of reducing this effect and lowering the resistance. In the embodiment, the dopant layers 14 prevent an increase in resistance by allowing an atomic or molecular species to be intercalated in the graphene layer 13 or to be disposed on the graphene layer 13.

The atomic or molecular species intercalated in the graphene layer 13 or disposed on the graphene layer 13 is a material for increasing the conductivity of graphene. Specifically, such a material is preferably at least one atomic or molecular species selected from the group consisting of $N_2$, B, $O_2$, $F_2$, $Cl_2$, $Br_2$, $I_2$, Co, Ni, Fe, Ru, Cu, Na, Li, K, Sc, Y, La, Zr, Hf, Ir, and Pt. The molecular species may include a compound containing at least one atom selected from the group.

The dopant layers 14 include any of the atoms, the compounds, or the metal films shown below. The dopant layers 14 contain the atomic or molecular species to be intercalated in the graphene layer or disposed on the graphene layer. The dopant layers 14 are provided on at least part of the side surfaces of the graphene layer 13. In FIG. 1, the dopant layers 14 are each provided over the entire side surface of the graphene layer 13. The dopant layers 14 may be thin films because they only need to have a structure capable of presenting such an atomic or molecular species to the graphene layer 13. Specifically, the dopant layers 14 may have a thickness of from 0.1 nm to 10 nm.

The dopant layers 14 may include, for example, $N_2$ or a compound of B. Nitrogen or boron atoms can be diffused from the dopant layers 14 into the graphene layer 13 to fill vacancies for carbon atoms in the graphene layer 13, to supply electrons or holes into the graphene layer, and to lower the resistance.

The dopant layers 14 may include, for example, an elemental metal such as Co, Ni, Fe, Ru, or Cu, or an alloy, a carbide, or other compounds containing any of these metals. These metal atoms can strongly bind to graphene and therefore can modify the band structure and convert semiconducting graphene to metallic graphene.

The work function difference between the metal film and graphene causes charge transfer so that electrons or holes can be supplied to the graphene. Materials with a work function significantly different from that of graphene, such as alkali metals such as Na, Li, and K, rare earths such as Sc, Y, and La, and transition metals such as Zr, Hf, Ir, and Pt are preferably used for the metal film.

The dopant layers 14 may include, for example, an alkali metal-containing compound, a rare earth element-containing compound, a halogen or halogen-containing compound such as $F_2$, $Cl_2$, $Br_2$, or $I_2$, a metal oxide, elemental iodine, or the like. These molecules or atoms constituting these molecules can move between layers in the graphene wiring 10 or move onto a layer in the graphene wiring 10 to supply holes or electrons to the graphene layer 13.

As the width of the graphene wiring 10 decreases, the influence of the adverse factor mentioned above (the semi-metallic graphene may be turned into a semiconductor and have increased resistance) can become significant. In the embodiment, however, this drawback can be attenuated. Therefore, for example, even if the wiring width is as small as about 10 nm, the volume resistivity of the wiring can be made about one to two digits lower than that of graphene with no atomic or molecular intercalant. In the embodiment, for example, the graphene wiring 10 can have a volume resistivity of 25 μm·cm.

The presence of the atomic or molecular species intercalated in (or disposed on) the graphene layer can be checked by a method including observing changes in Raman spectrum. More specifically, a specific atom- or molecule-derived peak, which is not detectable for an untreated graphene layer, can be observed, and graphene G peak splitting can also be observed. If both phenomena are observed, it can be determined that graphene is doped with an atomic or molecular species other than graphene so that holes or electrons are supplied to graphene.

The semiconductor device of the embodiment may be of any type capable of being produced with the graphene wiring 10, such as a NAND-type flash memory or an LSI such as a logic device.

The conductive film 1 is, for example, a conductive member as a part of a semiconductor substrate for LSI or the like.

The contact plug 2 is, for example, an interlayer wiring.

The contact layer insulating film 3 is, for example, an interlayer wiring insulating film.

Next, a method of manufacturing the semiconductor device having the graphene wiring of the embodiment shown in the schematic perspective view of FIG. 1 will be described. In the embodiment, the semiconductor device may be of any type, and therefore, a method of manufacturing the graphene wiring 10 in the semiconductor device having the conductive film 1, the contact plug 2, and the insulating film 3 will be specifically described.

Figure 2:
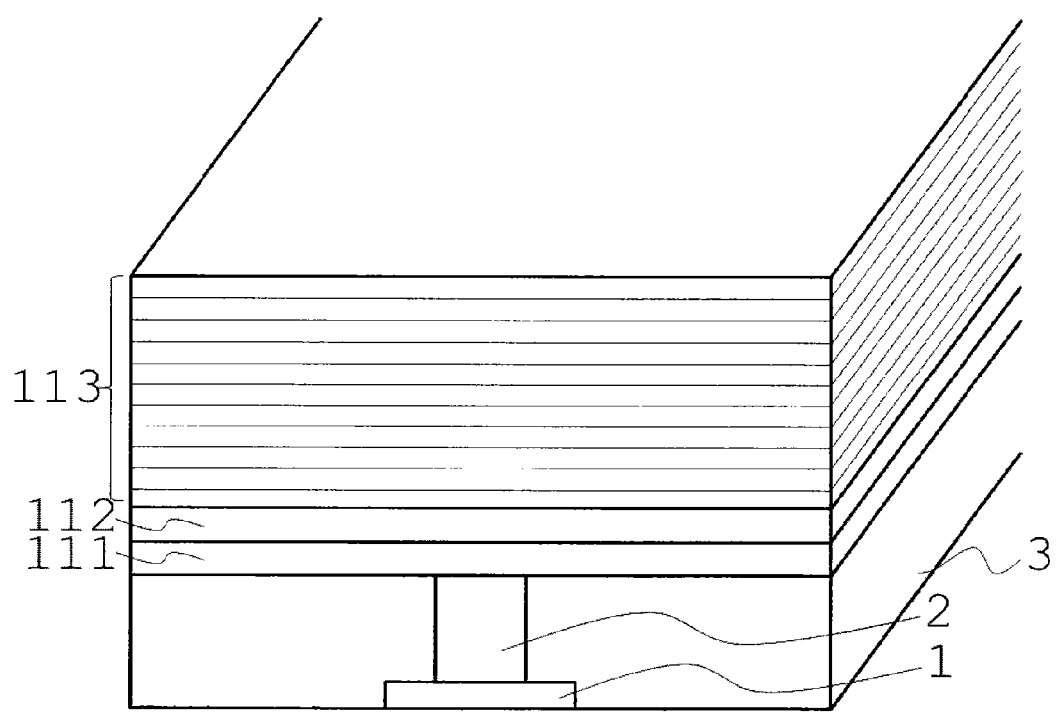
FIG. 2 is a schematic perspective view showing a method of manufacturing a graphene wiring of an embodiment.
Figure 3:
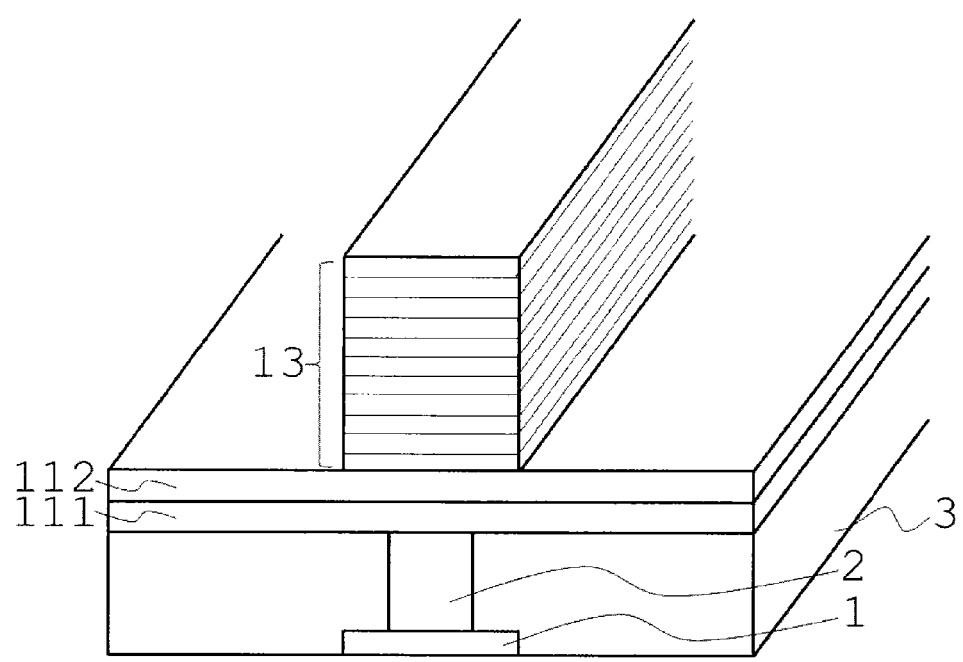
FIG. 3 is a schematic perspective view showing a method of manufacturing a graphene wiring of an embodiment.
Figure 4:
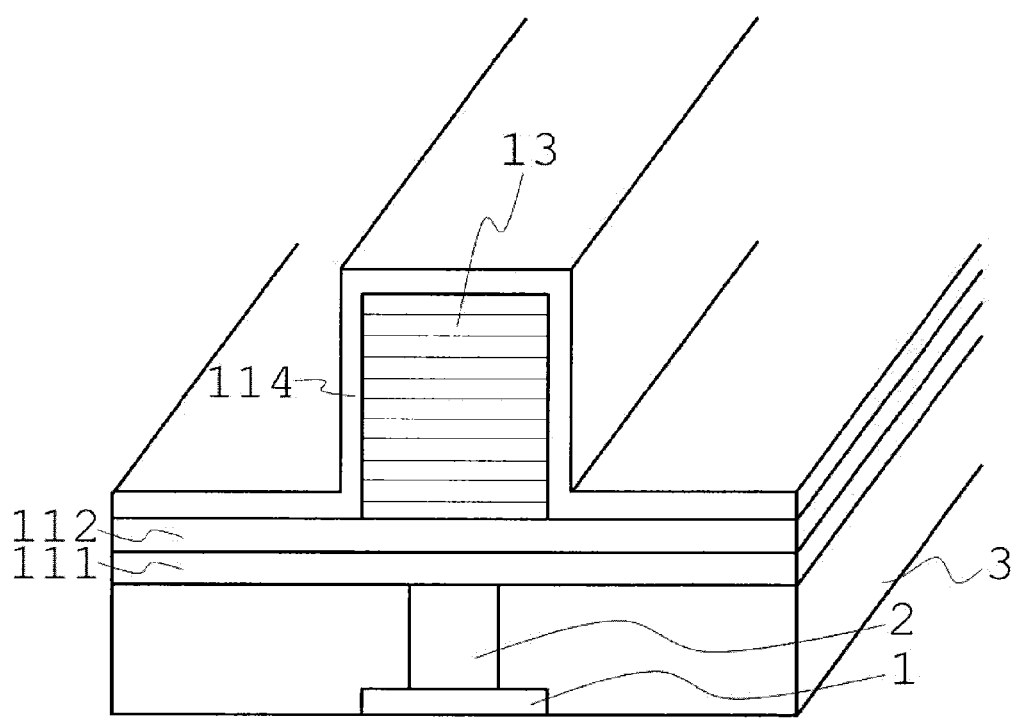
FIG. 4 is a schematic perspective view showing a method of manufacturing a graphene wiring of an embodiment.

FIGS. 2 to 4 are schematic perspective views showing a method of manufacturing the semiconductor device 100 according to the embodiment of FIG. 1.

(First Step)

First, as shown in FIG. 2, a catalyst backing layer 111 is formed on the contact plug 2 and the contact layer insulating film 3.

The catalyst backing layer 111 can be formed by chemical vapor deposition (CVD) or the like, in which each suitable material is deposited to form a film with an adjusted thickness. A catalyst layer 112 can also be formed in the same way as the catalyst backing layer 111.

(Second Step)

Subsequently, a graphene layer 113 is formed. For high-quality growth of graphene, the catalyst metal layer 112 is preferably subjected to a plasma pretreatment before the formation of the film. The plasma pretreatment is the step of forming the catalyst metal layer 112 into fine particles. The plasma pretreatment as the step of forming fine particles is performed using gas such as $H_2$, Ar, or $N_2$ at a treatment temperature in a range of 25° C. to 300° C. for a treatment time in a range of 30 seconds to 300 seconds. The treatment may be performed at a time using the gas, or the treatment may be performed by two or more separate steps using different gases.

Subsequently, using plasma CVD or the like, low-temperature ultrathin carbon film deposition and carbon deposition are performed as needed on the part having undergone the step of forming fine particles, so that the component of FIG. 2 is formed. Both the low-temperature ultrathin carbon film deposition and the carbon deposition do not always have to be performed, and only one of them may be performed. The low-temperature ultrathin carbon film deposition includes performing a treatment with a plasma containing carbonaceous gas such as methane at a temperature in a range of 200° C. to 400° C. for a short time such as about 30 seconds. The carbon deposition includes performing deposition using a plasma containing carbonaceous gas such as methane at a temperature in a range of 300° C. to 700° C. A remote plasma is preferably used in order to obtain a high-quality graphene film.

(Third Step)

Subsequently, as shown in FIG. 3, part of the graphene layer 113 is patterned, for example, using a combination of lithography and reactive ion etching (RIE). The patterned graphene layer 13 has a wiring pattern. The wiring pattern may be any desired pattern.

(Fourth Step)

Subsequently, as shown in FIG. 4, a dopant layer 114 is deposited on the component including the graphene layer 13 of FIG. 3 having the wiring pattern. The deposition method may be CVD or the like. An atomic or molecular species constituting the dopant layer 114 is allowed to migrate to the graphene layer 13 by the deposition method. If desired, a heat treatment may be performed to promote the migration of the atomic or molecular species from the dopant layer 114 to the graphene layer 13.

(Fifth Step)

Subsequently, the dopant layer 114, the catalyst layer 112, and the catalyst backing layer 111 are patterned into a wiring form, for example, using a combination of lithography and RIE. The dopant layer 114 is patterned to remain on each side surface of the graphene layer 13, and the catalyst layer 112 and the catalyst backing layer 111 are also patterned together with the dopant layer 114. After this step, the semiconductor device 100 having the graphene wiring 10 shown in FIG. 1 is obtained.

The graphene wiring according to the embodiment provides a low-resistance wiring because the graphene intercalation compound used to form the wiring has an electron or hole density higher than that of common graphene. In addition, the dopant layer provided on the side of the graphene layer can efficiently supply holes or electrons to the edge of the graphene to reduce the scattering effect. The dopant layer can be formed under mild conditions, so that an increase in resistance can be prevented, which would otherwise be caused by corrosion of the catalyst layer or other layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene wiring, comprising:
   a substrate;
   a catalyst layer on the substrate;
   a stack of graphene layers on the catalyst layer; and
   a first dopant layer on a first side surface of the stack of graphene layers; and
   a second dopant layer on a second side surface of the stack of graphene layers, wherein
   an atomic or molecular species is intercalated in the graphene layer,
   a bottom side of the stack of graphene layers is on the catalyst layer,
   the first dopant layer and the second dopant layer include the atomic or molecular species,
   the bottom side of the stack of graphene layers is in physical contact with the catalyst layer,
   the dopant layers are in physical contact with the first side surface of the graphene layer and the second side surface of the graphene layer,
   each graphene layer of the stack of graphene layers is parallel to the catalyst layer,
   a surface of the first dopant layer is in physical contact with each edge of the stack of graphene layers at the first side, and
   a surface of the second dopant layer is in physical contact with each edge of the stack of graphene layers at the second side.

2. The wiring according to claim 1, wherein
   a width of the stack of graphene layers is in a range of 3 nm to 30 nm, and
   the width of the stack of graphene layers is a distance between the first side surface of the stack of graphene layers and the second side surface of the stack of graphene layers.

3. The wiring according to claim 1, wherein the atomic or molecular species is at least one selected from the group consisting of Co, Ni, Fe, Ru, Cu, Na, Li, K, Sc, Y, La, Zr, Hf, Ir, and Pt.

4. The wiring according to claim 1, wherein the stack of graphene layers is multiple layers of graphene sheets including at most 100 layers.

5. The wiring according to claim 1, wherein a thickness of the first dopant layer of the second dopant layer is in a range of 0.1 nm to 10 nm.

6. The wiring according to claim 1, wherein the first side surface of the stack of graphene layers and the second side surface of the stack of graphene layers are parallel to a lamination direction of the graphene.

7. The wiring according to claim 1, wherein the first side surface of the stack of graphene layers is opposite to the second side surface of the stack of graphene layers.

8. The wiring according to claim 1, wherein the first side surface of the stack of graphene layers and the second side surface of the stack of graphene layers face a surface that extends in a longitudinal direction of the wiring.

9. The wiring according to claim 1, wherein the stack of graphene layers is sandwiched in between the first side surface of the stack of graphene layers and the second side surface of the stack of graphene layers.

10. The wiring according to claim 1, wherein
    a width of the stack of graphene layers is in a range of 3 nm to 100 nm, and
    the width of the stack of graphene layers is a distance between the first side surface of the stack of graphene layers and the second side surface of the stack of graphene layers.

11. The wiring according to claim 1, wherein an entirety of the bottom side of the stack of graphene layers is in physical contact with the catalyst layer.

12. The wiring according to claim 1, wherein
    the surface of the first dopant layer which is in physical contact with each edge of the stack of graphene layers at the first side is vertical to a surface of the bottom side of the stack of graphene layers, and
    the surface of the second dopant layer which is in physical contact with each edge of the stack of graphene layers at the second side is vertical to the surface of the bottom side of the stack of graphene layers.

13. The wiring according to claim 1, wherein
    the surface of the first dopant layer which is in physical contact with an entirety of each edge of the stack of graphene layers at the first side is vertical to a surface of the bottom side of the stack of graphene layers, and
    the surface of the second dopant layer which is in physical contact with an entirety of each edge of the stack of graphene layers at the second side is vertical to the surface of the bottom side of the stack of graphene layers.

* * * * *